PUSHBUTTON SWITCHES

Original Filed Feb. 4, 1969 4 Sheets-Sheet 1

Inventor:
RUDOLF SCHADOW

By

OSTROLENK, FABER, GERB & SOFFEN

ATTORNEYS

PUSHBUTTON SWITCHES

Original Filed Feb. 4, 1969 4 Sheets-Sheet 2

Inventor:
RUDOLF SCHADOW
By
OSTROLENK, FABER, GERB & SOFFEN
ATTORNEYS

Inventor:
RUDOLF SCHADOW
By
OSTROLENK, FABER, GERB & SOFFEN
ATTORNEYS

Inventor:
RUDOLF SCHADOW
By
OSTROLENK, FABER, GERB & SOFFEN
ATTORNEYS

United States Patent Office

Re. 27,963
Reissued Apr. 9, 1974

27,963

PUSHBUTTON SWITCHES

Rudolf Schadow, 23 Konigsbachev Zeile,
1 Berlin 28, Germany

Original No. 3,582,592, dated June 1, 1971, Ser. No. 796,516, Feb. 4, 1969. Application for reissue Dec. 15, 1972, Ser. No. 315,532
Claims priority, application Germany, Feb. 21, 1968, P 16 90 203.7; June 10, 1968, P 17 65 562.8
Int. Cl. H01h *3/50, 13/56*
U.S. Cl. 200—159 R 22 Claims

Matter enclosed in heavy brackets [ ] appears in the original patent but forms no part of this reissue specification; matter printed in italics indicates the additions made by reissue.

ABSTRACT OF THE DISCLOSURE

A pushbutton switch is provided with a slider with a stop part extending into a groove in the slider. The stop part is held in position by a retractible helical spring parallel to the slider.

Pushbutton switches

The present invention relates to pushbutton switches and more particularly though not exclusively to such switches which comprise at least one replaceable pushbutton slider which is adapted to operate contact bridges cooperating with contact bridges fixed to a housing.

One object of the present invention is to provide an improved pushbutton switch.

A further object of the invention is to provide such a switch with a stop which can be removed in a particularly simple manner.

A further object of the invention is to provide a pushbutton switch in which the stop part cooperates with a detent groove and is pressed against the bottom of the groove by resilient means. A still further object of the invention is to provide pushbutton switches whose function can be modified in a particularly simple manner.

The present invention consists in a pushbutton switch comprising at least one pushbutton slider which is adapted to operate contact bridges fixed on a housing of the switch, and is urged by a helical spring against a stop to locate the slider in a position of rest, the stop being removable from the switch to allow the pushbutton slider to be removed and reinserted in the general direction of its longitudinal axis, the stop being held in place and at least partially surrounded by the spring.

In accordance with a preferred feature of the invention the stop can be completely surrounded by the spring.

In accordance with embodiments of the invention to be described below the stop forms one of two generally parallel limbs of a generally U-shaped part, the limbs being connected by a crosspiece which makes an oblique angle with the axis of the slider and at least one coil of the spring rests on the crosspiece and exerts a force acting along the line perpendicular to the slider.

With such a construction it is only necessary to retract the spring, either with the fingers or with tweezers, in order to remove the stop and then the slider. Owing to the fact that the crosspiece makes an oblique angle with the axis of the slider, a force perpendicular to the axis of the slider exerted by the helical spring will take up any play between the undersurface of the slider and the bottom of the housing. This ensures precise positioning of the pushbutton and serves to cut down noise produced on operating the switch.

The parallel limbs of the U-shaped part can have different lengths and/or fit in grooves of different depths so as to ensure that the crosspiece is oblique in relation to the slider axis.

One limb of the U-shaped part can be arranged to serve as a pivot while the other limb, which is pressed towards the slider axis by the spring, is arranged to cooperate with a detent slot for holding the slider. The limb acting as a pivot can fit in a longitudinal travel limiting groove in the slider, in which it is held by the spring. In this case a cover plate of the switch can have a curved slot running across the slider over the detent slot in the slider for enabling the one limb of the U-shaped part to move in a direction which is generally perpendicular to the axis of the slider.

The detent slot and the longitudinal groove can be arranged side by side in the slider.

Alternatively the slot and the longitudinal groove can be arranged one behind the other in the direction of the axis of the slider and U-shaped parts of different lengths are provided.

In accordance with a further possible construction the groove coalesces with the detent slot in the slider and two U-shaped parts are provided with different lengths for cooperating respectively with two straight grooves in the slider or with a straight groove in the slider and a slot arranged to act as a detent.

In accordance with a further embodiment of the invention a detent mechanism comprises an U-shaped part with parallel limbs of which one pivots in a hole while the other extends through an opening into a detent slot provided in the slider of the switch.

A still further object of the invention is to provide a pushbutton switch in which the stop part, which can be U-shaped, is loaded evenly irrespective of tolerances in diameter in the spring.

Accordingly the present invention also consists in a pushbutton switch comprising a housing, a slider mounted in the housing, a pushbutton on the slider, a U-shaped part with generally parallel limbs, one of the limbs being arranged to pivot while the oher extends through an opening in the housing into a detent slot in the slider, and a helical spring which surrounds the U-shaped part to hold it in position and abuts axially against a shoulder on the U-shaped part.

With this arrangement the U-shaped part can easily be removed by drawing the spring away from it, while when the spring abuts axially against the shoulder it exerts a tilting moment on the U-shaped part so as to press one of the limbs towards the slider. If this limb is the limb which fits into the detent slot, the detent action is improved. The coils of the spring surrounding the U-shaped part therefore have the twin purposes of preventing the U-shaped part falling out of position and of ensuring that there is a proper engagement in the detent slot.

The shoulder on the U-shaped part can be in various different forms. If the U-shaped part is made by pressing, the part of it connecting the two limbs can be provided with two steps facing in opposite directions so as to provide a hump. If, as is preferred, the U-shaped part is made of wire the shoulder can be constituted by a single step which has a part which is substantially parallel to the two limbs, the spring surrounding part of the connecting part and abutting axially against the shoulder.

In accordance with a preferred form of the invention, the helical compression spring surrounds the slider in a conventional manner, ends at a position adjacent to the pushbutton and serves to load the pushbutton.

However, alternatively, the helical spring can extend parallel to the slider but not surround it. In this case the spring can be mounted partially within the slider.

Although in the embodiment of the invention about to be described with reference to the drawings the spring is arranged to load the slider and the pushbutton, this is not essential and the end of it remote from the U-shaped part can about against a fixed part.

Embodiments of the invention will now be described with reference to the accompanying drawings.

FIG. 1 is a longitudinal section through a pushbutton switch in accordance with the invention.

FIG. 2 is a plan view of a chassis with two switches. The switch shown in the upper part of this figure corresponds to that shown in FIG. 1 and has no detent means for retaining it in position, i.e., its slider is moved back into the outer position when it is released. The switch shows in the bottom part of FIG. 2 has detent means in the form of a detent slot 18 and limb 13 for holding the slider in a pushed-in position.

Figure 1:
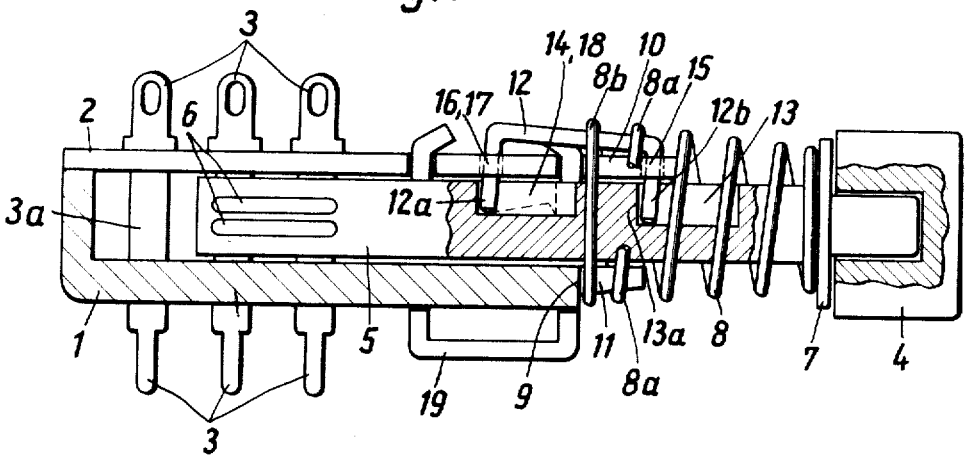
Figure 2:
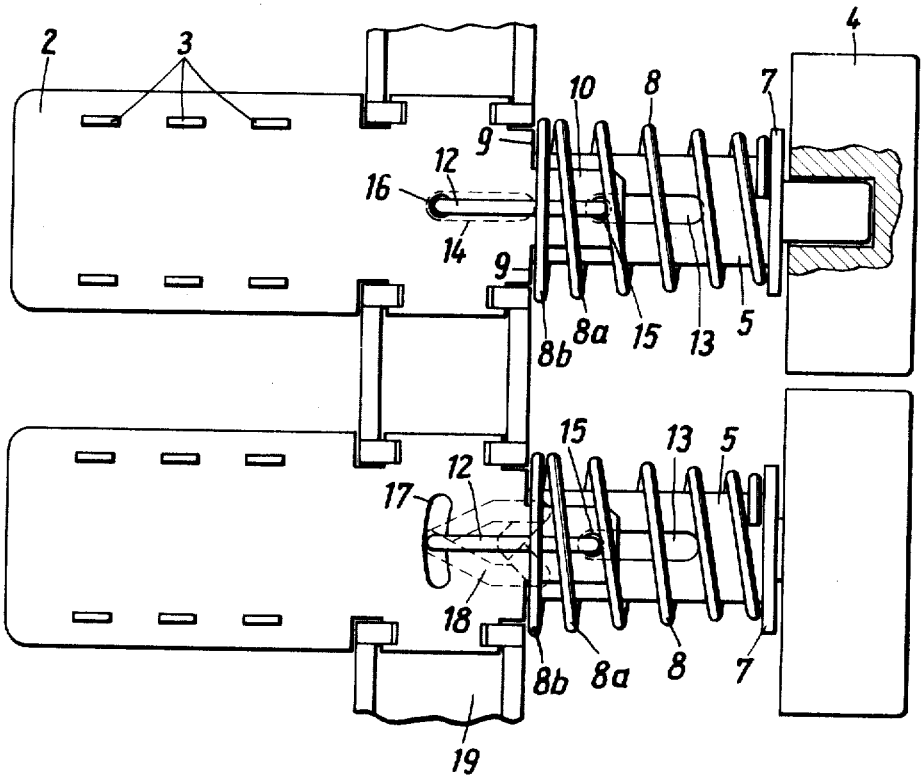

The switch shown in FIG. 1 and the top part of FIG. 2 comprise a housing 1 which is of U-shaped cross section and includes a cover plate 2. The plate 2 is held on the rest of the housing by means of rivetted or bent over soldering tags 3 which project to both sides and are produced integrally with stationary contacts 3a. The housing 1 carries the movable push rod or slider 5 of the pushbutton switch. The slider 5 carries a pushbutton 4 at one end and has lateral contact bridges 6 which cooperate with the stationary contacts 3a and in both switching position connects two of the stationary contacts electrically on one side and two on the other.

A return spring 8 for the slider abuts at one end against a shoulder part 7 of the slider while the other end abuts against the front end of the housing 1 and the abutment shoulder 9 on the cover plate 2. The return spring 8 is centered by the projection 10 on the cover plate and the projection 11 on the housing. The coils 8a and 8b of the spring surrounding these projections hold a stop in the form of a limb 12b in a longitudinal travel limiting groove 13 in the slider 5. The limb 12b passes through a hole in cover plate 2. The force of the spring 8 along the axis of the slider presses the end 13a of the groove against the limb 12b. The latter forms part of a U-shaped part generally denoted by reference numeral 12. The other limb 12a of the part 12 extends through a hole 16 in the cover plate 2 into a second longitudinal groove 14 in the slider 5. The limb 12a is made longer than limb 12b or the longitudinal groove 14 is made shallower than groove 13 so that the crosspiece of the U-shaped part connecting the limb 12a and 12b is oblique in relation to the axis of the slider. As a result the resilient force of the spring exerts a vertical component on the slider.

As shown in FIG. 2 two forms of switches in accordance with the invention can be mounted on a common chassis 19, the one having two straight grooves 13 and 14 in accordance with FIG. 1, while the other has a detent slot instead of a groove 14. In both switches the spring 8 can be drawn back towards the bottom 4 so that the U-shaped parts 12 can be litfed out of position and the sliders can then be pulled out forward. Assembly is brought about by reversing the operations.

The lower switch shown in FIG. 2 is provided with a detent mechanism which ensures that the slider remains in the position into which it is pushed and is then moved back into the initial position when it is pushed again. In the case of the switch shown in FIG. 1 on the top part of FIG. 2 there is no such mechanism and instead there is only a travel limiting slot into which one limb of the U-shaped part fits in order to prevent the slider being drawn out of the housing.

In the case of two or more pushbutton switches with detents mounted side by side means can be provided for causing release of one switch when another switch is actuated. Such arrangements are well known to those in the art and are not described.

In the case of pushbutton switch shown in the lower half of FIG. 2 the limb 12a of the U-shaped part 12 extends through a transverse curved slot 17 in the cover plate so that it can move laterally and extends into a heart-shaped detent slot which is capable of holding the slider and pushbutton in the depressed position. The bottom of the slot is ramped and stepped as indicated in dotted lines in FIG. 1 to ensure that relative travel of the limb 12a along the slot is only possible in one direction. The bottom of the limb is pressed against the bottom of the slot by the spring 8. The limb 12b serves as a pivot.

Figure 3:
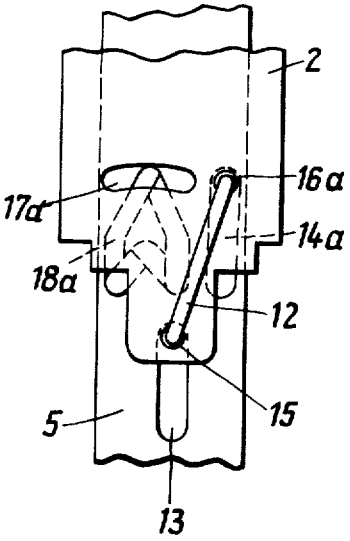
FIGS. 3 to 5 show different forms of detent mechanisms for switches in accordance with the invention.

In the case of the embodiment of the invention shown in FIG. 3, the detent slot 18a is substantially heart shaped and arranged beside the travel limiting groove 14a. Over the detent slot there is a transverse arcuate slot 17a in the cover plate 2 while over the groove 14a there is a hole 16a in plate 2. In accordance with whether a detent action is required or not, the U-shaped part 12 is either placed so at its front limb extends through the slot 17a into the detent slot 18a, or through the hole 16 into the travel limiting groove 14a. In both cases the part 12 is retained by spring 8.

Figure 4:
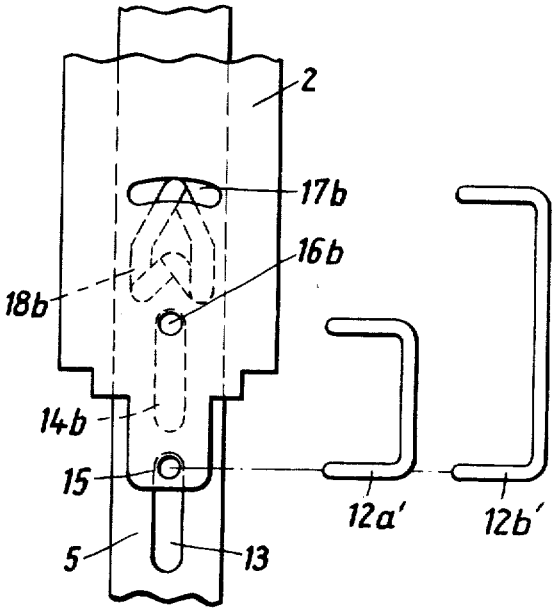

In the case of tee narrow switches in which the heart-shaped detent slot and the travel limiting groove cannot well be placed alongside one another, the detent slot 18b can be arranged in front of or behind the travel limiting groove 14b, as is indicated in FIG. 4. Here as well there is a curved slot 17b in the plate 2 of the detent slot 18b, and over the travel limiting groove 14b there is a hole 16b. If a detent locking arrangement is required in which the depressed position of the switch slider is to be held, a U-shaped part 12b' is placed so that its one limb projects through the cover plate hole 15 into the groove 13 while its other limb projects through the the curved slot 17b into the detent slot 18b. If a detent action is not required a shorter U-shaped part 12a' is used whose limbs extend through holes 15 and 16b in the plate into the travel limiting groove 14b and the groove 13.

Figure 5:
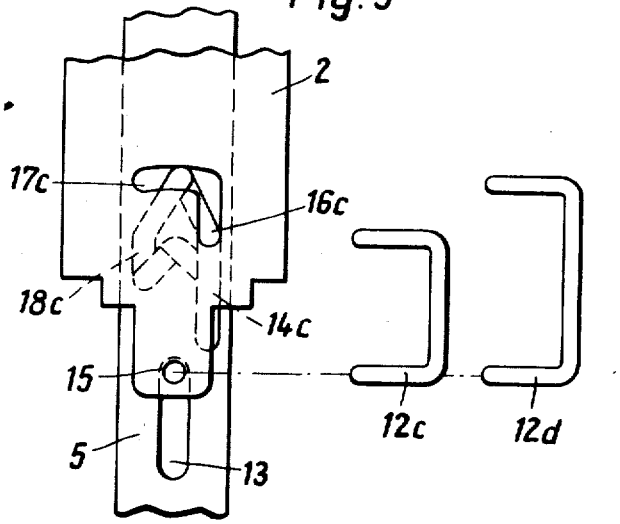

For a short and narrow construction of pushbutton switch the arrangement shown in accordance with FIG. 5, in which the detent slot 18c and the travel limiting groove 14c coalesce is preferred. A cover plate opening for the U-shaped parts comprises a curved slot 17c and a section 16c extending in the direction of the slider. If a locking action in the detent slot is not required a longer U-shaped part 12b is used and its one limb extends into the hole 15 while the other extends through the slot 17c into the detent slot 18c. If no detent action is required a shorter U-shaped part 12c is used. One limb of the U-shaped part then extends through hole 15 in the cover plate and into the groove 13 while the other limb extends through the section 16c and into the travel limiting groove 14c. The U-shaped parts are prevented from coming out of position by spring 8.

One advantage of the switches shown in FIGS. 3 to 5 is that the detent mechanism and a simple travel limiting means are provided in a single switch and the required function is obtained by setting the U-shaped part. Thus stocking of the switches is considerably simplified.

Figure 6:
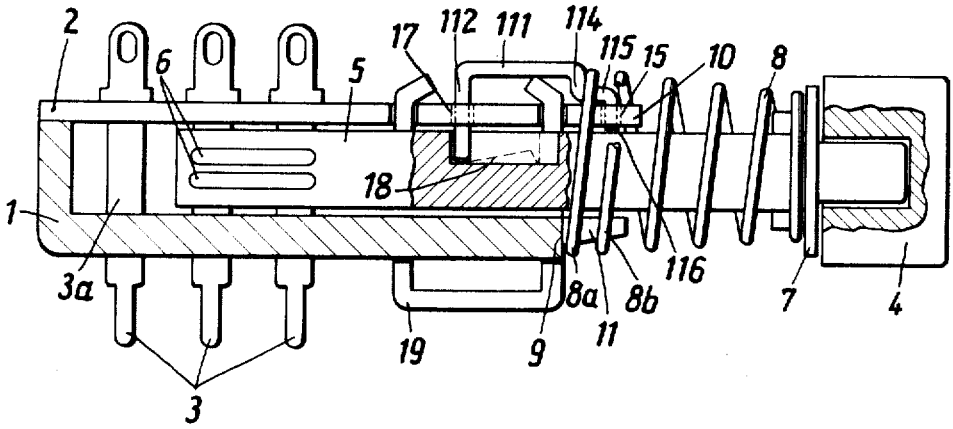
FIG. 6 is a longitudinal section of a pushbutton switch in accordance with the invention.
Figure 7:
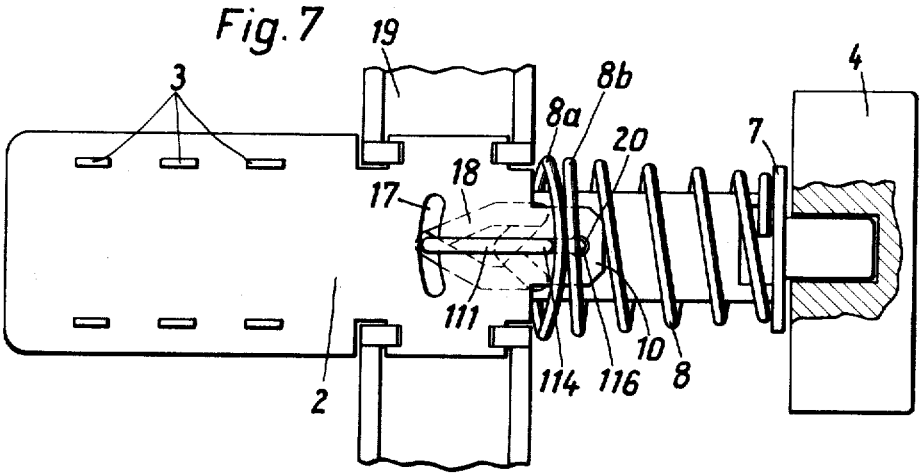
FIG. 7 is a plan view of the switch shown in FIG. 1.

The switch shown in FIG. 6 is provided with a housing 1 of U-shaped cross section. The housing is closed over by a cover plate 2 which is held in position on the housing by means of bent over or rivetted soldeing tags which project upwards and downwards. The slider 5 of the pushbutton switch is carried in the housing 1 so that it can move in the direction of its length. At its outer end the slider carries a pushbutton 4. The slider 5 carries lateral contact bridges 6 which cooperate with fixed contacts 3 so that in each of its two positions two fixed contacts are connected together on one side of the slider and two on the other.

A helical compression spring 8, serving as a return spring for the slider 5, rests at one end against an abutment 7 mounted on the slider while its other end abuts, inter alia, against a face 9 on the housing. The return spring 8 is centered by a projection 11 on the housing and a projection 10 on the cover plate 2. The coil 8a and 8b of the spring surrounding these projections also surround a wire part 111, 115, with a stepped part 114, which is generally parallel to the plate 2, and hold the part in place. The wire part 111, 115 forms the connecting part of an U-shaped part with two generally parallel limbs 112 and 116 of different length. The short limb 116 is pivoted in a hole 20 in the projection 10 on the cover plate. The last coil 8a of the compression spring abuts on the shoulder formed by the step 114 in the wire connecting part 111 at a position opposite to the face 9. The spring therefore tilts the limb 112 vertically downwards with the required force for causing the limb 112, which projects through a slot 17 in the cover plate 2, to engage a detent slot 18 in the slider for holding the slider in two switching positions.

Several such switches can be mounted on a chassis 19 in a conventional manner or can be used separately.

The wire U-shaped part 111 can be modified in shape providing that it has a shoulder (step 114) against which the compression spring 8 can abut at a position behind the limb 116, that is to say between the limbs 116 and 112.

Figure 8:
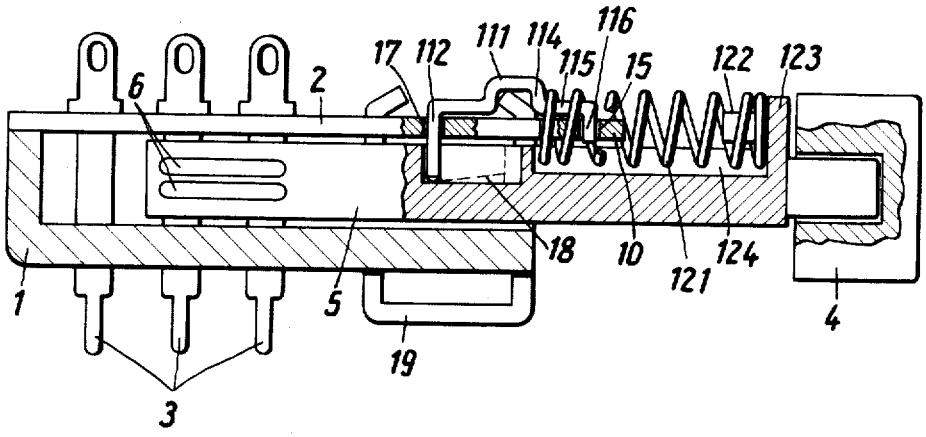
FIG. 8 is a longitudinal section of a further embodiment of the invention.

Such a modified embodiment of the invention is shown in FIG. 8. In this case the helical compression spring 121, corresponding to spring 8 is mounted above the slider 5 and surrounds the projection 10 of the cover plate 2, at the other end the spring 121 rests against a projection 123 on the slider and is centered by a peg 122 on this projection. The upper surface of the slider is provided with a groove 124 for partially accommodating the spring 121.

It will be seen that the U-shaped part 111 has two steps facing in opposite directions. One of the steps provides the shoulder for axial abutment of the spring 121.

In accordance with a further possibility afforded by the invention, a helical compression spring can be used which has one end resting against the stationary abutment while the other end engages the U-shaped part. In this case the helical compression spring does not serve the purpose of returning the pushbutton and slider.

I claim:

1. A pushbutton switch comprising:

a housing;

an elongated slider arranged to move in the housing along a substantially straight axis;

contact bridge means on the slider;

contacts mounted in the housing for cooperation with the contact bridge means;

removable stop means extending through an opening in the housing into the slider in a direction generally perpendicular to the axis in order to locate the slider in at least one particular position along its axis of movement;

and a helical spring which has an axis parallel to the axis of movement of the slider and normally at least partially surrounds the stop means to retain the latter in operative position, the helical spring being capable of being compressed for uncovering the stop means and permitting removal of the stop means from the slider in a direction generally perpendicular to the axes.

2. A switch in accordance with claim 1 in which the stop comprises a generally U-shaped part with two generally parallel limbs and a crosspiece connecting the limbs, the crosspiece having a spring engaging surface which makes an angle with the axis of movement of the slider.

3. A switch in accordance with claim 2 in which the spring engaging face of the U-shaped part makes an acute angle with the axis of movement of the slider.

4. A switch in accordance with claim 2 in which one limb of the U-shaped part fits in a hole in the housing and acts as a pivot and extends into a longitudinal groove in the slider.

5. A switch in accordance with claim 4 with a detent slot beside the groove in the slider, one limb of the U-shaped part being capable of being selectively fitted in the slot or in the travel limiting groove.

6. A switch in accordance with claim 2 in which a detent slot and a travel limiting groove are provided in the slider, the switch further comprising two such U-shaped parts which may be fitted selectively in position so that one limb of the one U-shaped part fits into the detent slot or the one limb of the other such U-shaped part fits into the travel limiting groove.

7. A switch in accordance with claim 6 in which the slot and the travel limiting groove are placed one behind the other in the direction of the axis of movement of the slider.

8. A switch in accordance with claim 2 comprising a coalescing travel limiting groove and a detent slot in the slider, the switch comprising two such U-shaped parts which may be fitted selectively in position so that one limb of the one U-shaped part fits into the detent slot or the one limb of the other such U-shaped part fits into the travel limiting groove.

9. A switch in accordance with claim 2 in which [tee] *the* spring engaging face on the U-shaped part is substantially perpendicular to the axis of movement of the slider and is formed by a step in the U-shaped part.

10. A switch in accordance with claim 1 in which the helical spring surrounds the slider, ends at a position adjacent to the pushbutton, and serves to load the pushbutton.

11. A switch in accordance with claim 1 in which the slider is arranged outside the helical spring.

12. A switch in accordance with claim 1 in which the spring is mounted partially within the slider.

13. A switch in accordnace with claim 1 in which an end of the spring remote from the stop abuts against a fixed part.

*14. A pushbutton mechanism for use in a switch comprising:*

*a housing;*

*an elongated slider arranged to move in the housing along a substantially straight axis, said slider adapted for actuating a switch;*

*removable stop means extending through an opening in the housing into the slider in a direction generally perpendicular to the axis in order to locate the slider in at least one particular position along its axis of movement; and*

*a helical spring which has an axis parallel to the axis of movement of the slider and normally at least partially surrounds the stop means to retain the latter in operative position, the helical spring being capable of being compressed for uncovering the stop means and permitting removal of the stop means from the slider in a direction generally perpendicular to the axes.*

*15. A pushbutton mechanism in accordance with claim 14 in which the stop comprises a generally U-shaped part with two generally parallel limbs and a crosspiece connecting the limbs, the crosspiece having a spring engaging surface which makes an angle with the axis of movement of the slider.*

*16. A pushbutton mechanism in accordance with claim 15 in which the spring engaging face of the U-shaped part makes an acute angle with the axis of movement of the slider.*

*17. A pushbutton mechanism in accordance with claim 15 in which one limb of the U-shaped part fits in a hole in the housing and acts as a pivot and extends to a longitudinal groove in the slider.*

*18. A pushbutton mechanism in accordance with claim 17 with a detent slot beside the groove in the slider, one limb of the U-shaped part being capable of being selectively fitted in the slot or in the travel limiting groove.*

*19. A pushbutton mechanism in accordance with claim 15 in which a detent slot and a travel limiting groove are provided in the slider, the switch further comprising two such U-shaped parts which may be fitted selectively in position so that one limb of the one U-shaped part fits into the detent slot or the one limb of the other such U-shaped part fits into the travel limiting groove.*

*20. A pushbutton mechanism in accordance with claim 19 in which the slot and the travel limiting groove are placed one behind the other in the direction of the axis of movement of the slider.*

*21. A pushbutton mechanism in accordance with claim 15 comprising a coalescing travel limiting groove and a detent slot in the slider, the switch comprising two such U-shaped parts which may be fitted selectively in position so that one limb of the one U-shaped part fits into the detent slot or the one limb of the other such U-shaped part fits into the travel limiting groove.*

*22. A pushbutton mechanism in accordance with claim 15 in which the spring engaging face on the U-shaped*

*part is substantially perpendicular to the axis of movement of the slider and is formed by a step in the U-shaped part.*

References Cited

The following references, cited by the Examiner, are of record in the patented file of this patent or the original patent.

UNITED STATES PATENTS

| | | | |
|---|---|---|---|
| 3,229,548 | 1/1966 | De Rougemont et al. | 200—153 JX |
| 3,274,354 | 9/1966 | Stevens | 200—153 UXJ |

FOREIGN PATENTS

| | | | |
|---|---|---|---|
| 1,233,456 | 2/1967 | Germany | 200—159 R |
| 1,164,260 | 9/1969 | Great Britain | 200—153 J |
| 64,981 | 7/1968 | Germany | 200—169 PB |

ROBERT K. SCHAEFER, Primary Examiner

R. A. VANDERHYE, Assistant Examiner

U.S. Cl. X.R.

74—527; 200—153 J, 169 PB